United States Patent [19]

Nepela

[11] Patent Number: 5,793,279
[45] Date of Patent: *Aug. 11, 1998

[54] METHODS AND COMPOSITIONS FOR OPTIMIZING INTERFACIAL PROPERTIES OF MAGNETORESISTIVE SENSORS

[75] Inventor: Daniel A. Nepela, San Jose, Calif.

[73] Assignee: Read-Rite Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 702,977

[22] Filed: Aug. 26, 1996

[51] Int. Cl.$^6$ .............. H01L 43/00; G01R 33/02; G11B 5/39
[52] U.S. Cl. .............. 338/32 R; 324/252; 360/113; 427/130
[58] Field of Search .............. 338/32 R; 427/130, 427/131, 132, 404; 204/192 EC; 324/252, 207.21; 360/113, 75, 128

[56] References Cited

U.S. PATENT DOCUMENTS

| | | | |
|---|---|---|---|
| 4,132,614 | 1/1979 | Cuomo et al. | 204/192 EC |
| 5,206,590 | 4/1993 | Dieny et al. | 324/252 |
| 5,287,238 | 2/1994 | Baumgart et al. | 338/32 R |
| 5,442,508 | 8/1995 | Smith | 360/113 |
| 5,452,163 | 9/1995 | Coffey et al. | 360/113 |
| 5,476,680 | 12/1995 | Coffey et al. | 427/130 |

*Primary Examiner*—Peter S. Wong
*Assistant Examiner*—Rajnikant B. Patel
*Attorney, Agent, or Firm*—Nathan N. Kallman

[57] ABSTRACT

A method for maximizing the interfacial properties of magnetoresistive sensors, such as spin valve and GMR sensors used in storage devices, comprises selecting the materials for ferromagnetic layers and for electrically conductive spacers that are interposed between the ferromagnetic layers. The electronegativities of the selected materials are substantially matched so that an absolute value of the differences in electronegativities is minimized. The conductive spacer material provides a relatively low resistivity and a large mean free path. The sensors experience greater chemical and thermal stability, are corrosion resistant, and realize an increased signal output.

25 Claims, 5 Drawing Sheets

METHODS AND COMPOSITIONS FOR OPTIMIZING INTERFACIAL PROPERTIES OF MAGNETORESISTIVE SENSORS

FIELD OF THE INVENTION

This invention relates to methods and compositions for optimizing the interfacial properties of magnetoresistive sensors, and specifically data storage devices such as spin valve sensors and giant magnetoresistive (GMR) sensors.

DESCRIPTION OF THE PRIOR ART

Significant progress has occurred over the past two decades in the design of multilayered nanostructured thin film systems. Large GMR current-in-plane (CIP) effects have been described in a Fe/Cr multilayered system, approximating a magnetoresistance effect ($\Delta R/R$) of 100 percent, which is a change by a factor of two in resistance with an adequate external field. Since then, many other multilayer GMR and spin valve sensors have been explored. To date, the highest GMR effect is in the Fe/Cr system and is approximately 150 percent at a measurement temperature of 5° K., and remains the largest value observed at any temperature to date. Both the GMR and spin valve effects are characterized by $\Delta R/R$, which is defined as the change in resistance divided by the initial resistance, and is $(R_0-R_H)/R_0$, where $R_0$ is the sensor resistance without an external magnetic field and a $R_H$ is the resistance at a minimum external field required to maximize $\Delta R/R$.

Numerous theoretical studies have attempted to explain the behavior of spin valve and GMR effects. However, there does not currently exist an explanation of the main factors controlling the magnitude of the sensor response, as characterized by $\Delta R/R$, as it relates to the required properties of the conductive spacers and ferromagnetic (FM) layers constituting such device. Experimental efforts have been largely based on trial and error, by investigating with various combinations of FM layers and conductive spacer layers. None of the previous work has yielded quantitative guidelines for the maximization of $\Delta R/R$ for spin valve or GMR sensors by providing selection criteria for the layer compositions of the FM material and the conductive spacer.

SUMMARY OF THE INVENTION

An object of this invention is to provide means and methods for optimizing the manufacturing process of various magnetoresistive devices, including but not limited to thin film devices such as sensors used in data storage devices.

Another object of this invention is to provide guidelines for optimizing the selection of multilayer compositions by matching or minimizing the difference in the electronegativities ($\chi$) of adjacent ferromagnetic layers and conductive spacers.

Still another object of the present invention is to maximize the signal output, as represented by $\Delta R/R$ of spin valve sensors and GMR sensors.

A further object of this invention is to maximize the thermal stability of spin valve sensors and GMR sensors.

Yet another object of this invention is to maximize the corrosion resistance of spin valve sensors and GMR sensors.

Another object of the invention is to provide conductive spacers which minimize electromigration in the FM and spacer layers, which extend the useful lifetimes of spin valve and GMR sensors.

Another object is to provide for multiple interfacial matching of an FM layer with its contacting conductive spacers. In accordance with this invention, spin valve sensors and GMR sensors are made with layers of FM material and conductive spacers interposed between the FM layers. The difference in electronegativities between the layers and spacers is minimized. A relatively low resistivity and/or a large mean free path is provided by the conductive spacer material. As a result of these conditions, the $\Delta R/R$ of the sensor is maximized. The novel sensor is also corrosion resistant, exhibits greater chemical and thermal stability, and signal output of the sensor device is increased.

A method for optimizing the interfacial properties of a magnetoresistive sensor, such as a GMR or spin valve, is disclosed. The method includes selecting one or more FM layers having at least a first electronegativity, and selecting one or more conductive spacers having at least a second electronegativity, such that the selecting steps include the step of substantially matching or minimizing the difference between the first and second electronegativities and thereby minimizing the difference between the electronegativities of the selected spacers and FM layers.

BRIEF DESCRIPTION OF THE DRAWING

The invention will be described in greater detail with reference to the drawings in which.

Similar numerals refer to similar elements in the drawings. It should be understood that the sizes of the different components in the figures are not necessarily in exact proportion, and are shown for visual clarity and for the purpose of explanation.

DETAILED DESCRIPTION OF THE INVENTION

Figure 1:
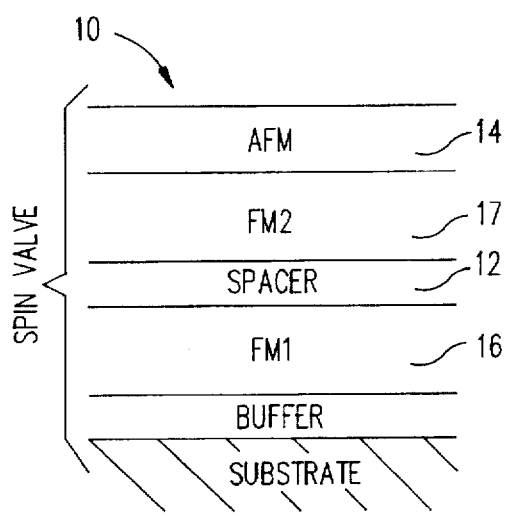
FIG. 1 is a cross-sectional view depicting a spin valve sensor made in accordance with this invention.

FIG. 1 is a partial cross-section representing a spin valve magnetoresistive (MR) sensor 10 made according to the present invention. The spin valve sensor 10 is formed of two FM layers (i.e., FM1 and FM2), that are separated by a conductive spacer or layer 12. The sensor 10 is formed on a nonmagnetic substrate on which a buffer layer, about 25–100 Angstroms (A°) thick, is deposited. The buffer layer is made from Ta, Cr, Fe, Pt, Pd, Ir or Au. The FM layers FM1 and FM2 may have the same or different composition. If the difference in coercivity between FM1 and FM2 is sufficient (e.g., approximately 50 to 100 Oersteds), a magnetoresistance effect will be observed when an external field changes from positive to negative and a magnetic configuration of one of the layers changes while the other remains stationary. Alternatively, (as shown in FIG. 1), the magnetization of one of the FM layers, (e.g., FM2), may be pinned by placing it in atomic contact with an antiferromagnetic (AFM) layer 14, such as an FeMn layer. The magnetization of the unpinned FM layer FM1 is free to rotate in the presence of an external magnetic field.

The application of an external magnetic field causes a variation in the magnetization orientation of the FM layer FM1, which causes a change in the spin-dependent scattering of conduction electrons and thus in the electrical resistance of the spin valve sensor 10. The resistance of the spin valve sensor 10 changes as the relative alignment of the magnetization of the FM1 layer changes. The FM2 layer remains constrained and its magnetization direction remains the same.

The present invention includes an empirical relationship between ΔR/R and the electronegativity difference between adjacent FM layers and conductive spacer layers in spin valve and GMR sensors. This relationship applies to both spin valve and GMR sensors, and shows that ΔR/R response is a function of the electronegativity mismatch between adjacent FM layers and conductive spacers. It is believed that the mismatch in electronegativities results in a potential barrier at the interface that is related to the absolute value of the difference in the electronegativities of the FM layers and the conductive spacers, i.e., $|\Delta\chi|$. With increasing $\Delta\chi$ mismatch, the ΔR/R amplitude of the spin valve and GMR sensors will decrease to a point where ΔR/R will approach an intercept value of zero. As shown later, this intercept value uniformly occurs at a value of $|\Delta\chi|^{1/2}$ approximately equal to 0.5 for both spin valve and GMR sensors indicating that the underlying mechanism for obtaining ΔR/R is the same for both types of sensors.

Thus, according to a preferred embodiment, the spin valve sensor 10 (FIG. 1) is formed by selecting the desired spacer material. Subsequently, the FM layers FM1 and FM2 are selected such that their average electronegativities match or substantially approximate the average electronegativity of the selected spacer 12.

Another condition of the empirical relation relates to the crystal structures of the FM and spacer layers. The FM and spacer layers preferably should have the same or similar crystal structure, e.g., a face-centered cubic ("FCC") FM layer adjacent to an FCC conductive spacer layer or a body-centered cubic ("BCC") FM layer adjacent to a BCC spacer layer. These combinations are referred to herin as "FCC Systems" and "BCC Systems", respectively. The lowest $|\Delta\chi|$ reported in an FCC System is in the range of approximately 0.12 eV. For example, a GMR device comprising 70Co:30Fe FM layers and Ag spacers exhibited a ΔR/R of approximately 100 with a $|\Delta\chi|$ of approximately 0.12 eV. The lowest $|\Delta\chi|$ reported in a BCC System is in the range of approximately 0.07 eV. For example, in the GMR device described previously (i.e., Fe/Cr) having a ΔR/R of approximately 150, had a $|\Delta\chi|$ of approximately 0.07 eV. Magnetoresistive sensors according to the invention can achieve lower $|\Delta\chi|$ values and, consequently, higher ΔR/R sensor outputs than previously reported values.

Figure 2:
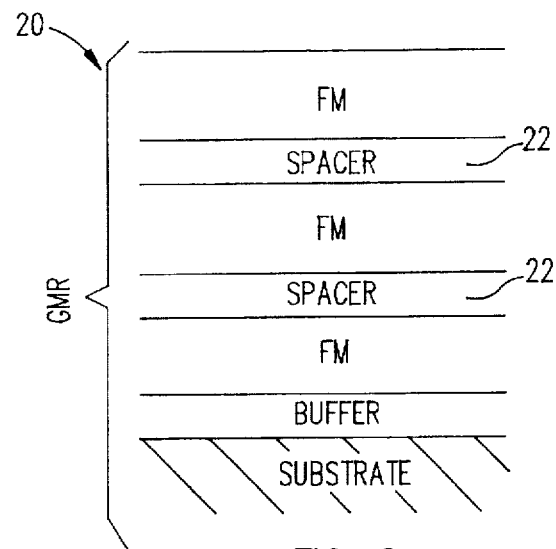
FIG. 2 is a cross-sectional view depicting a GMR sensor made in accordance with this invention.

FIG. 2 illustrates the use of the present inventive concept in a GMR sensor 20. The GMR sensor 20 is a sandwich structure formed of a plurality of layers, such as FM materials, that are separated by a plurality of conductive spacers 22. Although not shown in FIG. 2, the FM/spacer structure can have a multiplicity of repeat units of FM/spacer. In the GMR sensor 20 the electronegativities of each of the successive layers FM are substantially matched or their difference in $\chi$ is minimized with respect to the electronegativity of the contiguous spacers 22.

Figure 3:
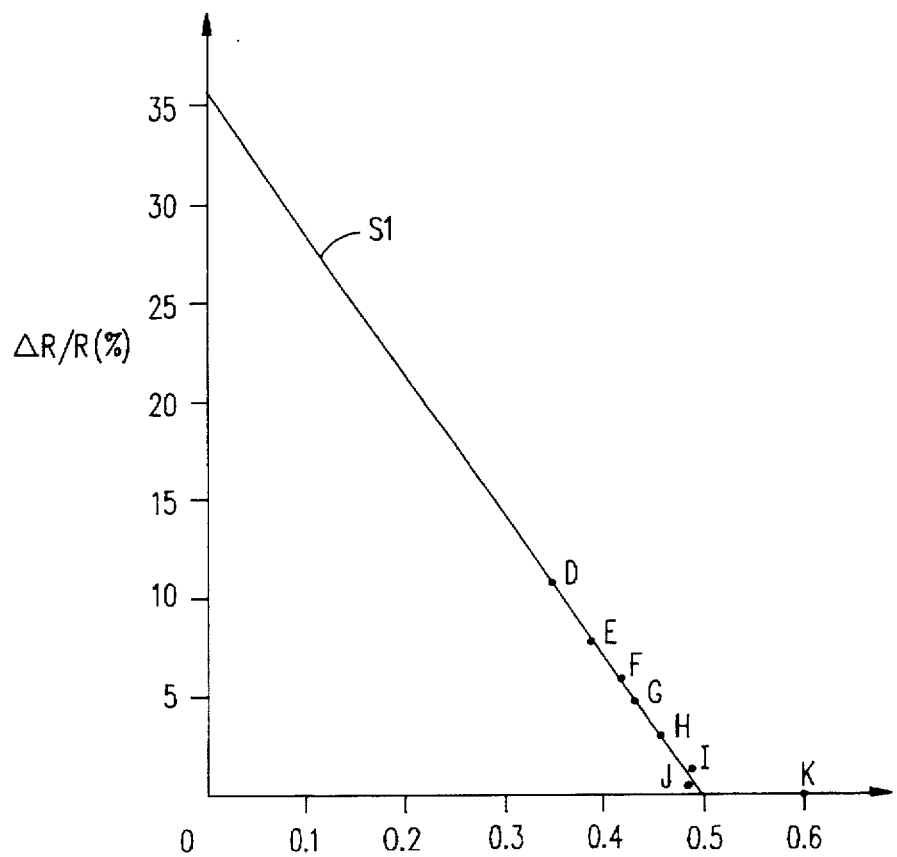
FIG. 3 is a graph plotting a relationship between a square root of the absolute value of an electronegativity difference (i.e., $|\Delta\chi|^{1/2}$) versus $\Delta R/R$ for spin valve sensors with various ferromagnetic/conductive spacer interfaces.
Figure 4:
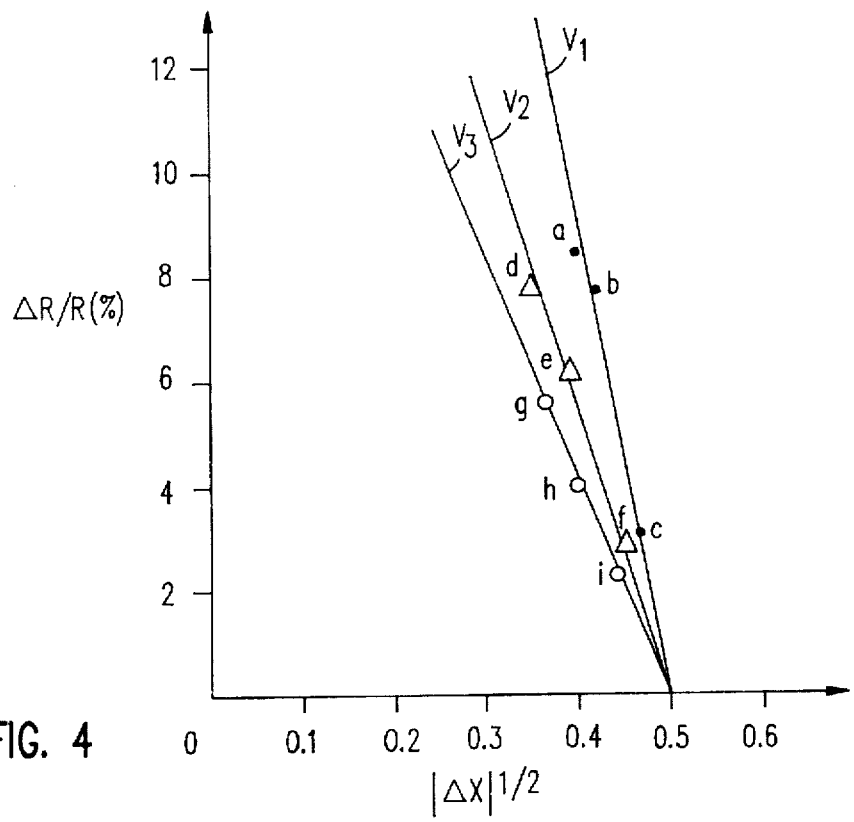
FIG. 4 illustrates three curves plotting the relationship between $|\Delta\chi|^{1/2}$ versus $\Delta R/R$ for various spin valve sensors at different temperatures.
Figure 5:
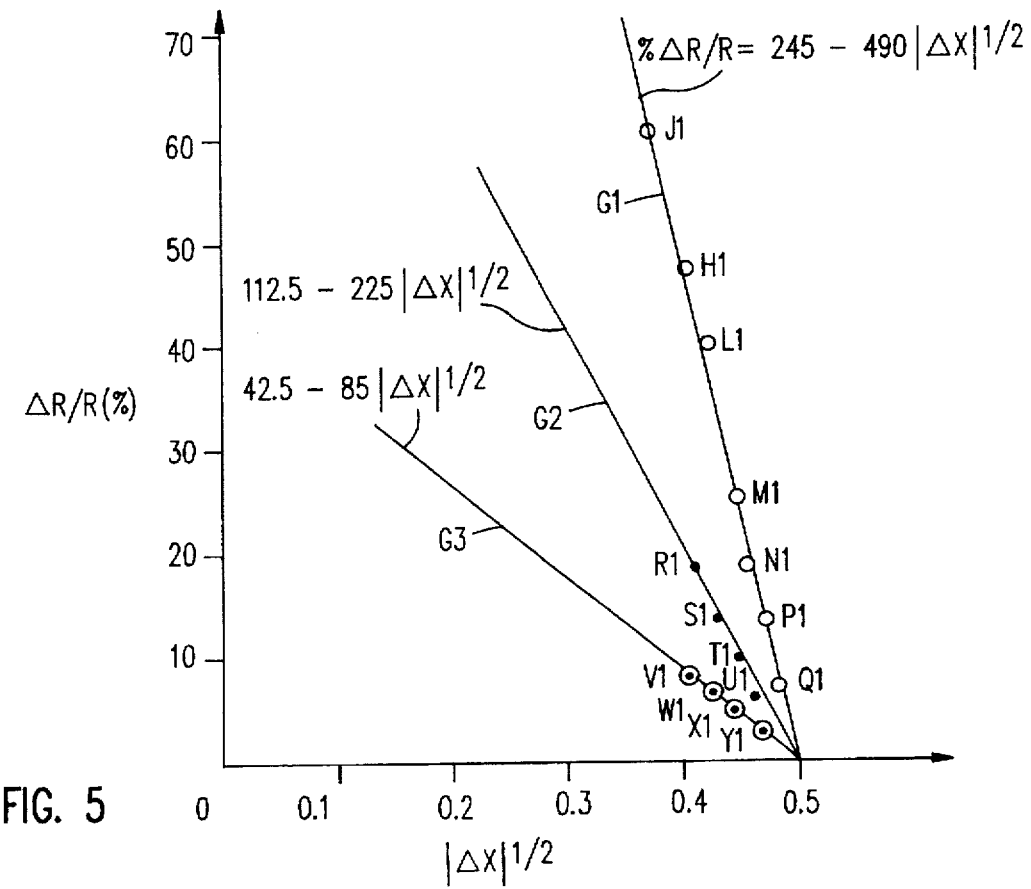
FIG. 5 illustrates three curves plotting the relationship between $|\Delta\chi|^{1/2}$ versus $\Delta R/R$ for various GMR sensors illustrating the first, second and third peaks of GMR response.
Figure 6:
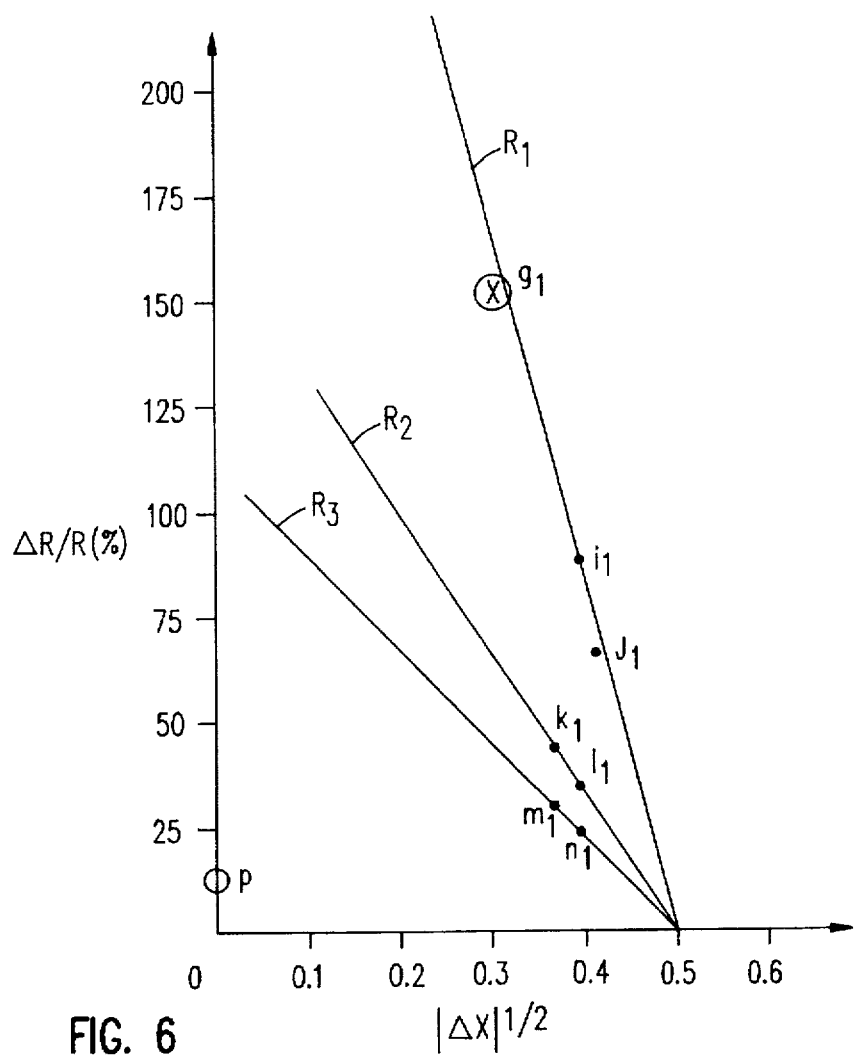
FIG. 6 illustrates a curve plotting the relationship between $|\Delta\chi|^{1/2}$ versus $\Delta R/R$ for various GMR sensors having various crystal structures.

FIG. 3 illustrates that the linear relationship of the invention is generally maintained irrespective of the composition of the FM and spacer materials. Further, FIG. 4 illustrates that the linear relationship is maintained over a wide range of measurement temperatures. FIG. 5 illustrates that linear relationship holds for a variety of FM alloy compositions for a fixed spacer element. Further, FIG. 6 illustrates that the linear relationship holds for both FCC Systems and BCC Systems.

The percent ionic content of an interface A/B between an FM layer A and a conductive spacer B can be estimated by the electronegativity difference between the FM A and the spacer B as shown in the following equation (Pauling, "The Nature of the Chemical Bond", 98 (1060, 3d)):

$$\text{Percent Ionic Content} = (1 - e^{(\chi_A - \chi_B)^{2/4}}) \times 100$$

By applying the foregoing empirical finding that $|\Delta\chi|^{1/2} \cong 0.5$ when ΔR/R approaches zero, it is possible to estimate the percent ionic content of the interface A-B. Specifically, when $|\chi_A - \chi_B|^{1/2} = |\Delta\chi|^{1/2} = 0.5$, the ionic content at the interface A-B is approximately 1.5 percent.

Additionally, at the intercept point where ΔR/R approaches zero, the excess ionic energy at the FM/spacer interface can be estimated to be 1.96 Kcal or 0.085 eV (Pauling, Table 3–6 at page 90). This energy term relates to the electron transmission at the interface, which influences ΔR/R. Thus, at $|\Delta\chi|^{1/2}$ equal to 0.5 electron volts, the probability of electron transmission through a potential barrier at the interface is approximately 0 percent.

By an appropriate selective matching of the electronegativities of the spacer 12 (FIG. 1) and the adjacent FM layers FM1 and FM2, it is possible to maximize the magnetoresistive response (as characterized by ΔR/R), and thus the signal output of the spin valve sensor 10 is maximized.

It is also preferable that the bulk resistivities of the materials used in the FM layers and conductive spacers be relatively low to ensure a high ΔR/R sensor output. For example, in both GMR and spin valve sensors it is desirable that the bulk resistivities of the FM layer material be less than 100 microohm (μΩ) cm, and the spacer material be less than 30 μΩ-cm.

Another aspect of the invention is the relationship illustrated by the following equations:

$|\Delta\chi|=\chi(FM)-\chi(spacer)$, (1a)

where:

$\chi(spacer)=0.44\phi(spacer)-0.15$, (1b)

and $\chi(FM)=0.44\phi(FM)-0.15$, (1c)

where $\chi(FM)$ represents the electronegativity of the FM layers; $\chi(spacer)$ represents the electronegativity of the spacer 12; and where $\phi(spacer)$ and $\phi(FM)$ are the work functions of the spacer 12 and FM layers, respectively, as stated in Lange, "Handbook of Chemistry", 3–9 (1973, 11d). Both $\chi$ and $\phi$ values are expressed in electron volts (eV.).

Each chemical element has a work function $\phi$ from which the $\chi$ of that element is computed by equations (1b) or (1c). For alloys or compounds containing additional elements that constitute either the FM material or the conductive spacer used in the GMR or spin valve sensors, the $\chi$ of such mixtures has been found to be an additive property of the constituents of the alloy. The $\chi$ of the mixture is the sum of the products of the atomic fraction of any element in the mixture times the electronegativity of that element summed over all elements constituting the mixture, as illustrated in the following equation:

$$\chi_{(a-b-c)}=f_a\chi_a+f_b\chi_b+f_c\chi_c,$$ (2)

where $f_a$, $f_b$, and $f_c$ refer to the atomic fractions of elements a, b and c, respectively forming the alloy; and $\chi_a$, $\chi_b$ and $\chi_c$ refer to the electronegativities of elements a, b and c, constituting the alloy. While only a ternary alloy has been considered for illustration purpose, it should be understood that the form of equation (2) is applicable to alloys with any number of elements. In addition, equation (2) applies both to ferromagnets and conductors.

Prior art methods for fabricating spin valve and GMR sensors included combining spacers made of an electrically conductive elements such as Au, Ag or Cu, with layers of FM materials such as FeCo, NiFe, or elements such as Fe, Co and Ni, without regard to the electronegativity matching between the successive FM layers and conductive spacers. These prior art methods are mainly based on trial and error studies.

The following Tables I and II provide listings of some exemplary conductors and ferromagnets, (i.e., FCC Systems and BCC Systems), respectively, that can be used to fabricate various devices, including but not limited to magnetoresistive sensors according to the invention.

The values for $\chi$ in Tables I and II were derived from electron work function data (as reported in Michaelson, "The Work Function of the Elements and Its Periodicity," Journal of Applied Physics, vol. 48, No. 11, November 1977, p. 4729) and equations (1)(b) and (c). Generally, the work functions for randomly oriented crystal structures were used, but if data was provided by Michaelson for specific crystal faces or phases, such work function values were averaged to calculate an average work function, which was used to calculate the following $\chi$ values. Further, if the work function for randomly oriented crystals was in the range of such average work function value (i.e., within five percent), the randomly oriented value was added to the previously described work function values and used to compute a second average work function value, which was then used to compute the $\chi$ values below. For alloys or compounds, equation (2) was used to compute the $\chi$ values below.

TABLE I

FCC SYSTEMS

| CONDUCTORS | $\chi$ (eV.) | FERROMAGNETS | $\chi$ (eV.) |
|---|---|---|---|
| Cu | 1.91 | 80Ni:20Fe | 2.084 |
| Ag | 1.89 | $Ni_3Fe^{(4)}$ | 2.07 |
| $Ag_3Pt^{(5)}$ | 2.00 | Au | $2.22–2.27^{(3)}$ |
| $Ni_3Mn^{(4)}$ | 2.02 | $Fe_4N$ | 2.12 |
| Pt | 2.34 | FePd | 2.11 |
| Pd | 2.32 | $Fe_{1-y}Au_y^{(1)}$ | $2.0 \leq \chi \leq 2.13$ |
| $Cu_3Pt^{(4)}$ | 2.02 | $Co_{1-z}Au_z^{(2)}$ | $2.07 \leq \chi \leq 2.14$ |
| $CuPt^{(4)}$ | 2.13 | $Fe_{0.485}Ni_{0.418}Mn_{0.097}$ | 1.99 |
| $CuPt_3^{(4)(5)}$ | 2.23 | 80Ni:20Fe | 2.084 |
| $Cu_3Pt_5^{(4)(5)}$ | 2.18 | 81Ni:19Fe | 2.086 |
| $Cu_3Au^{(4)}$ | $1.99–2.00^{(3)}$ | 90Co:10Fe | 2.04 |
| $Cu_3Pd^{(4)(5)}$ | 2.01 | 80Ni:20Fe | 2.084 |
| $CuPd^{(4)}$ | 2.06 | | |
| Rh | 2.04 | | |
| $CuAu^{(4)(5)}$ | $2.07–2.09^{(3)}$ | | |

$^{(1)}$Where y is an atomic fraction with a value between 0.30 and 0.70;
$^{(2)}$Where z is an atomic fraction with a value between 0.10 and 0.50;
$^{(3)}$the higher stated values for $\chi$ reflect the use of a larger work function for the <111> face of Au than that stated in Michaelson, which adjustment appears necessary when work function data for <111> faces of other FCC elements is compared to <110> work function data; and
$^{(4)(5)}$a pseudo-cubic structure, the stated composition is a superlattice structure.

As noted, some of the compounds in Table I are pseudo-cubic, but have lattice parameters close to FCC and provide a structure match adequate for an FCC System.

TABLE II

BCC SYSTEMS

| CONDUCTORS | $\chi$ | FERROMAGNETS | $\chi$ |
|---|---|---|---|
| Cr | 1.83 | $Fe_{1-u}Cr_u^{(1)}$ | $1.85 \leq \chi \leq 1.88$ |
| Cr | 1.83 | $Fe_{1-w}V_w^{(2)}$ | $1.85 \leq \chi \leq 1.87$ |
| Cr | 1.83 | Ternary FeCrV alloys | $1.84 \leq \chi \leq 1.87$ |
| Cr | 1.83 | $Fe_3Al^{(3)}$ | 1.86 |
| $AlFe_2$ | 1.84 | | |

$^{(1)}$Where u is an atomic fraction with a value between 0.40 and 0.70;
$^{(2)}$where w is an atomic fraction with a vaule between 0.25 and 0.35; and
$^{(3)}$the stated composition is a superlattice structure.

The following examples are provided for the purpose of illustration and explanation only. They are not intended to be exclusive or to limit the coverage of the present inventive concepts, including the selection process and the sensors. All compositions in the following examples are given in atomic percentage:

EXAMPLE 1

In Table I above, the electronegativities of the conductors and the ferromagnets represent the atomic fraction weighted electronegativities, as illustrated by the following example for $Cu_3Pt$:

$\chi(Cu_3Pt)=0.75\chi(Cu)+0.25\chi(Pt)=2.02$, where $\chi(Cu_3Pt)$ is the electronegativity of $Cu_3Pt$; $\chi(Cu)=1.91$; and $\chi(Pt)=2.34$. This example illustrates that the atomic fraction of the electronegativities of the elements of any alloy conductor or ferromagnet formed of any number of elements, i.e., ternary, quaternary, etc., can be used to calculate the electronegativity of the alloy.

By using Table I above, it is possible to closely match the electronegativities of the conductors and the ferromagnets.

For example, having selected $Cu_3Pt$ as the conductor of choice, it would be desirable to select a FM material having a close electronegativity. Table I indicates that one of the closest materials whose electronegativity matches that of $Cu_3Pt$ is $Ni_3Mn$, since the average electronegativity of $Ni_3Mn$ is 2.01 and $\Delta\chi$ of the combination is approximately |0.01|.

EXAMPLE 2

Another aspect of the invention concerns the use of materials exhibiting superlattice structures for FM layers and spacers in GMR and spin valve sensors. The prior art does not teach or disclose the use of such superlattice structures in MR sensors. Significant advantages in MR device performance can be achieved with such superlattice structures, even without the matching of $\chi$ values.

For example, $Ni_3Mn$, a ferromagnetic superlattice intermetallic compound having an electronegativity of 2.01, may be matched with $Cu_3Pt$, as described in Example 1. The matching of two superlattice structures is desirable in that these ordered structures will improve the thermal stability of sensors containing them. It is believed that this is due to the additional external thermal energy that would be required to disorder one or both superlattice structures before the elements contained in the superlattice would be free to diffuse at the interface. This additional energy ranges between 0.1 eV to 0.3 eV above the activation energy for diffusion across the interface between the conductor spacer and the FM layer and accordingly leads to greater thermal stability of the device. Greater corrosion resistance would also be achieved for such devices.

EXAMPLE 3

A subsequent inquiry may then be made as to whether there exists another ferromagnet with other desirable characteristics, such as minimal magnetostriction ($\lambda_s$) higher corrosion resistance, and/or lower resistivity than $Ni_3Mn$. $Ni_3Fe$, also a superlattice alloy, with an electronegativity of 2.07, may in certain applications present a more desirable match than $Ni_3Mn$, due to low coercivity ($H_c$), low $\lambda_s$ and superior corrosion resistance and may be matched with a CuAu superlattice having an $\chi$ of 2.07.

EXAMPLE 4

This example identifies conductive spacer alloys useful for the matching or minimizing the $\Delta\chi$ values between the spacer alloys and appropriate ferromagnetic elements or alloys thereof.

In addition to CuAu and CuPt alloys and their superlattice compositions referred to previously, binary, ternary or higher order alloys of elements such as Cu, Ag, Au, Pt, Pd, Ir, Rh and Ru may be used to match appropriate FMs and provide $\chi$ values ranging from approximately 1.89 to 2.33. Such alloys may be used to fabricate various devices, including but not limited to spin valve and GMR sensors, based on the electronegativity matching or minimizing of the differences in electronegativities of the present invention. Other superlattice alloys similar to CuPt and CuAu that exhibit ordering phenomena, such as $Ag_3Pt$ and AgPt, may also be used for implementing this invention.

EXAMPLE 5

A subsequent inquiry may then be made as to whether the crystallographic structures of the adjacent conductive spacer and the FM layer are matched. It is desirable to match the crystallographic structures of adjacent layers. The following is a list of additional intermetallic compounds having a FCC crystallographic structure for use as conductive spacer materials:

| | $\chi$ |
|---|---|
| $AgPt_3$ | 2.23 |
| $CrIr_3$ | 2.20 |
| $Cr_2Pt$ | 2.00 |

The following is a list of additional conductive spacer elements having a BCC crystallographic structure:

| | $\chi$ | | $\chi$ | | $\chi$ |
|---|---|---|---|---|---|
| Cr | 1.83 | V | 1.74 | Mo | 1.83 |
| W | 1.80 | Nb | 1.74 | Ta | 1.67 |

A number of the above elements such as W, Ta and Mo occur in high resistivity structures when deposited by evaporation or sputtering. However, by controlling deposition parameters (such as rates, substrate temperatures, and partial inert gas pressures, e.g., Ar), a low resistivity structure can be obtained, which is preferred for spacers in spin valve and GMR structures.

The following is an example confirming the desirability of matching the crystallographic structures of adjacent FM/spacer layers. Even though the electronegativity of Fe (1.90) closely matches the electronegativity of Ag (1.89), the resulting $\Delta R/R$ of the FeAg structure is small because of the Fe and Ag crystal structure dissimilarities and attendant potential barriers accruing therefrom. Specifically, Fe has a BCC structure, while Ag has an FCC structure.

EXAMPLE 6

The foregoing inventive principles and examples are applicable at room temperature as well as other temperatures, such as cryogenic temperatures, e.g., 5° K. Fe having a BCC structure and an electronegativity of 1.90, and Cr having a BCC structure as well and an electronegativity of 1.83 results in a very high $\Delta R/R$. This electronegativity mismatch is the smallest one experimentally measured, i.e., 0.07 and results in attainment of the highest observed $\Delta R/R$ (approximately 150 percent) at a 5° Kelvin measurement temperature.

FIG. 3 illustrates the linear relationship between the magnetoresistive response as characterized by $\Delta R/R$ of the spin valve sensor 10 (FIG. 1), relative to a square root of the absolute value of the electronegativity difference, (i.e., $|\Delta\chi|^{1/2}$) of the FM layers FM1, FM2 and the spacer 12, at room temperature, for a coupling field less than or equal to approximately 10 Oersteds. This linear relationship is represented by a curve S1. It is maintained for various spin valve layer compositions, representing a variety of spacer materials and FM materials and illustrates that the variable $\Delta\chi$ controls $\Delta R/R$. This relation may be expressed generally by the following equation (3):

$$\Delta R/R = A - B|\Delta\chi|^{1/2}, \tag{3}$$

where A and B are constant values.

Sample preparation variables may affect the slope B of this equation (3). It is generally recognized in the literature that a certain degree of roughness at the interface between the FM layers and the conductive spacers produces a maximum result ($\Delta R/R$) for a given interface, for instance, Dieny, "Giant Magnetoresistance in Spin-Valve Multilayers", Journal of Magnetism and Magnetic Materials, 136 (1994) pp. 335–359. As the roughness increases or decreases from its optimal value $\Delta R/R$ will decrease from its optimal value. This will change the slope B, but will not modify the general principles of the invention. Roughness variations will also not modify the intercept where $\Delta R/R$ equals 0, which remains at $|\Delta\chi|^{1/2}$ equals 0.5.

When spin valves and GMR sensors achieve the condition described by $|\Delta\chi|^{1/2}$ equal to or greater than 0.5, then $\Delta R/R$ equals 0 and B equals approximately 2A. In this case, equation (3) may be expressed as follows:

$$\Delta R/R = A - 2A|\Delta\chi|^{1/2} \qquad (4)$$

In an exemplary embodiment of the spin valve sensor 10, the general equation (3) may be expressed by the following experimentally derived equation (5) for spin valves formed by a variety of interfaces:

$$\Delta R/R = 32.3 - 64.6|\Delta\chi|^{1/2}. \qquad (5)$$

The following interfaces were used in deriving this equation: Co/Cu/Co, Co/Cu/80Ni:20Fe, 80Ni:20Fe/Cu/80Ni:20Fe, Co/Au/80Ni:20Fe, Ni/Cu/Ni, 80Ni:20Fe/Pt/80Ni:20Fe and 80Ni:20Fe/Pd/80Ni:20Fe. The following experimental examples verify equation (5) above.

EXAMPLE 7

Point D on curve S1 in FIG. 3 represents the following FM layer/spacer compositions: Co/Cu/Co, where the first element Co is the unpinned FM layer FM1, the second element Cu is the conductive spacer 12 (FIG. 1), and the third element Co is the pinned FM layer FM2. Pursuant to equation (5), the composition of this example yields a $\Delta R/R$ of approximately 9.5 percent.

EXAMPLE 8

Point E on curve S1 in FIG. 3 represents Co/Cu/80Ni:20Fe, where the first element Co is the unpinned FM layer FM1 (FIG. 1), the second element Cu is the conductive spacer 12, and the third element 80Ni:20Fe is the pinned FM layer FM2. Pursuant to equation (5), the composition of this example yields a $\Delta R/R$ of approximately 6.5 percent.

EXAMPLE 9

Point F on curve S1 in FIG. 3 represents 80Ni:20Fe/Cu/80Ni:20Fe, where the first element 80Ni:20Fe is the unpinned FM layer FM1 (FIG. 1), the second element Cu is the conductive spacer 12, and the third element 80Ni:20Fe is the pinned FM layer FM2. Pursuant to equation (5), the composition of this example yields a $\Delta R/R$ of approximately 5 percent.

EXAMPLE 10

Point G on curve S1 in FIG. 3 represents Co/Au/80Ni:20Fe, where the first element Co is the unpinned FM layer FM1 (FIG. 1), the second element Au is the conductive spacer 12, and the third element 80Ni:20Fe is the pinned FM layer FM2. Pursuant to equation (5), the composition of this example yields a $\Delta R/R$ of approximately 4.5 percent.

EXAMPLE 11

Point H on curve S1 in FIG. 3 represents Ni/Cu/Ni, where the first element Ni is the unpinned FM layer FM1 (FIG. 1), the second element Cu is the conductive spacer 12, and the third element Ni is the pinned FM layer FM2. Pursuant to equation (5), the composition of this example yields a $\Delta R/R$ of approximately 2.5 percent.

EXAMPLE 12

Point I on curve S1 in FIG. 3 represents 80Ni:20Fe/Pt/80Ni:20Fe, where the first alloy 80Ni:20Fe is the unpinned FM layer FM1 (FIG. 1), the second element Pt is the conductive spacer 12, and the third alloy 80Ni:20Fe is the pinned FM layer FM2. Pursuant to equation (5), the composition of this example yields a $\Delta R/R$ of approximately 0.3 percent.

EXAMPLE 13

Point J on curve S1 in FIG. 3 represents 80Ni:20Fe/Pd/80Ni:20Fe, where the first alloy 80Ni:20Fe is the unpinned FM layer FM1 (FIG. 1), the second element Pd is the conductive spacer 12, and the third alloy 80Ni:20Fe is the pinned FM layer FM2. Pursuant to equation (5), the composition of this example yields a $\Delta R/R$ of approximately 0.2 percent.

The $\Delta\chi$s in examples 7, 8, 9 and 11 yield positive values, whereas examples 10, 12 and 14 yield negative values of $\Delta\chi$; however, by using the absolute value, i.e., $|\Delta\chi|^{1/2}$, all combinations are predicted by the results of equation 5. This illustrates that the interfacial barrier characteristics are indifferent to the sign of $\Delta\chi$ and only respond to its magnitude.

EXAMPLE 14

Point K on curve S1 in FIG. 3 represents 80Ni:20Fe/Al/80Ni:20Fe, where the first alloy 80Ni:20Fe is the unpinned FM layer FM1 (FIG. 1), the second element Al is the conductive spacer 12, and the third alloy 80Ni:20Fe is the pinned FM layer FM2. The square root of the electronegativity difference $|\Delta\chi|^{1/2}$ between Al and its adjacent first alloy layer FM1 is approximately 0.6/eV, which is greater than the intercept point value of 0.5 eV. In this and other similar examples where $|\Delta\chi|^{1/2}$ is greater than 0.5 eV, i.e., greater than the intercept point, then $\Delta R/R$ is set equal to zero. This example illustrates that even when the crystallographic structures of adjacent layers are matched, i.e., both 80Ni:20Fe and Al have FCC structures, the sensor output signal ($\Delta R/R$) may be low because the $\chi$s of the layers are not matched. However, Al may be useful if its $\chi$ is matched with that of an appropriate FM material.

While the relationship described in the equations above, i.e., between the sensor output signal ($\Delta R/R$) and the absolute difference in electronegativities of adjacent layers has been described in view of data obtained at room temperature, further analyses confirm that these relationships are also valid for data obtained at other temperatures, including the normal sensor operating temperatures and at cryogenic temperatures as well. It should however be noted that, as shown in FIG. 4, the slope of the curve S1, i.e., the constant value A, will vary at different temperatures.

The relationship between $\Delta R/R$ and $|\Delta\chi|$ as previously expressed has been developed for spacer materials having bulk resistivities of approximately less than 10 $\mu\Omega$-cm. It is expected that some deviation from the linear relationship between $\Delta R/R$ and $|\Delta\chi|^{1/2}$ will occur for larger resistivities in the spacer materials, i.e., a partial loss in the expected value of $\Delta R/R$ with increasing resistivity of the spacer material above the range of approximately 10 $\mu\Omega$-cm.

The following examples 15 through 17 are made with reference to FIG. 4 which illustrates the temperature insensitivity of the linear relationships between the ΔR/R of the spin valve sensor 10 (FIG. 1) relative to the square root of the absolute value of the electronegativity difference $|\Delta\chi|^{1/2}$ of the average electronegativity of the pinned and unpinned FM layers FM1 and FM2 and the spacer 12. The response is shown at three different measurement temperatures, that is, 300° K., 200° K. and 100° K.

EXAMPLE 15

This example is represented by the curve V1 of FIG. 4 and graphically plots the linear relationship of equation (3) at a measurement temperature of 100° K. Points a, b and c reflect data for the following respective spin valve (FIG. 1) combinations:

unpinned FM layer FM1: Co (point a), 80Ni:20Fe (point b), and Ni (point c), pinned FM layer FM2: (80Ni:20Fe), and conductive spacer: Cu with an approximate thickness of 22A°.

The $\chi$ values used for the FM layers are the average of pinned and free layers, $(\chi_{free}+\chi_{pinned})/2$.

EXAMPLE 16

This example is represented by the curve V2 and graphically plots the linear relationship at a temperature of 200° K. Points d, e and f reflect data observed for similar compositions as in Example 15 above.

EXAMPLE 17

This example is represented by the curve V3 and graphically plots the linear relationship at a temperature of 300° K. Points g, h and i reflect data observed for similar compositions as in Examples 15 and 16 above.

For spin valve structures, the conductive spacer separating the FMs is generally between 18A° and 30A° thick, while the FMs generally range between 30A° and 120A° with an optimum thickness typically near 60A° each.

Prior to the teaching of the relationships of the forms of equations (3) and (4), no known method to maximize ΔR/R was available in the prior art. By using equations (3) and (4) it is now possible to rationalize the selection of the materials forming the FM layers and the conductive spacers, thus substantially minimizing or eliminating the need for conventional trial and error selection processes. Consequently, the selection process can now be automated and/or rationalized, and significant cost savings can be achieved in the development of superior spin valve and GMR sensors. More particularly, an appropriate selection of materials can significantly improve the signal output of the spin valve sensor 10 (FIG. 1), which is a result that is highly sought and of great commercial value.

FIG. 5 illustrates that the linear relationship of equation (3) for the GMR sensor 20 (FIG. 2) is exhibited for distinct MR peaks at particular spacer thicknesses. ΔR/R was measured at room temperature, for various Co Ni alloys. The resulting relationship s are represented by three exemplary curves G1, G2, G3, and are for various GMR FM layer compositions. The curves G1, G2, G3 may be expressed generally by the following equations (6), (7) and (8), that continue to verify the relationships of equations (3) and (4).

Curve G1 in FIG. 5 may be expressed by the following equation (6), and represents the GMR first peak at a Cu thickness of approximately 10A°:

$$\Delta R/R \cong 245 - 490 |\Delta\chi|^{1/2}. \tag{6}$$

Curve G2 in FIG. 5 may be expressed by the following equation (7), and relates to the second GMR peak at a Cu thickness of approximately 22A°:

$$\Delta R/R \cong 110 - 220 |\Delta\chi|^{1/2}. \tag{7}$$

Curve G3 in FIG. 5 may be expressed by the following equation (8), and represents the third GMR peak at a Cu thickness of approximately 32A° to 36A°:

$$\Delta R/R \cong 45 - 90 |\Delta\chi|^{1/2}. \tag{8}$$

While only three GMR peaks are shown in FIG. 5, well defined peaks at a fourth position (i.e., peaks 1 through 4) have been observed in GMR devices. These peaks generally occur at spacer thicknesses of approximately 10°, 20A°, 30A° and 40A°. It is known that both the peak ΔR/R and the switching field required to attain the maximum value of ΔR/R (at any peak) decline with increasing peak number (and increasing spacer thickness). However, the switching field at each increasing peak declines more rapidly than does ΔR/R at each peak. Thus, the sensitivity of the transducer as measured by ΔR/R/Oersted of switching field improves dramatically with increasing peak number. Consequently, the present invention is particularly useful in extending GMR performance to higher peak values at lower switching fields due to the minimizing of Δχ between FM and spacer layers. Thus, the present invention maximizes the device sensitivity at any peak but is most useful at large peak numbers that are inherently more sensitive, i.e., achieving a larger (ΔR/R/Oersted) than has been reported. Depending on the particular application, it is possible to select any of the GMR peaks. Additionally, in GMR structures the FM layers may range in thickness from approximately 4A° to 25A°.

By using equations (3) and (6), (7) and (8) it is possible to simplify the selection of the materials forming the various FM layers and conductive spacers 22 of the GMR sensor 20 (FIG. 2), similarly to what has been explained above in relation to the spin valve sensor 10 (FIG. 1). Again, the control of the interfacial roughness at the FM/spacer contact will be required to achieve maximum ΔR/R.

In addition, the following exemplary embodiments demonstrate that by a proper selection of the composition of the materials forming the sensor 20 (FIG. 2), and by matching or substantially minimizing the absolute electronegativity difference (or mismatch) of the sensor layers (FM layers and conductive spacers), it is possible to obtain significantly higher output signals (ΔR/R) than those previously attained. The foregoing linear relationships were mostly obtained using data at room temperature. Further analyses confirm that these relationships are also valid for data obtained or derived at other temperatures, including the sensor normal operating temperatures of approximately 45° C. and cryogenic temperatures as well. However, the slopes of the curve G1, G2 and G3, i.e., the value B, will vary at different temperatures.

An important aspect of the present invention may be derived from equations (6), (7) and (8), namely that all the curves G1, G2 and G3 converge at a single intercept point (I), at which ΔR/R equals 0, and $|\Delta\chi|^{1/2}$ equals approximately 0.5, regardless of the measurement temperatures and material compositions of the layers.

As previously stated, the need for optimizing the roughness of the interface for maximizing ΔR/R for any particular interface is important. Accordingly, different preparation conditions, such as different substrate temperatures, different deposition rates and different sputtering pressure, will result in different degrees of interfacial roughness. Accordingly, an optimal interfacial surface roughness should be selected to maximize the slopes of any curve G1, G2 or G3 and thereby achieving a maximum ΔR/R for any interface Δχ of the FM and spacer layers.

EXAMPLE 18

FIG. 5 shows FIG. 5 shows the value of ΔR/R for a GMR structure at three peaks as a function of the following NiCo alloy compositions for the FM layer. On the first GMR peak curve G1 in FIG. 5, the following points represent the stated compositions:

Point H1: 30Ni:70Co

Point J1: Co

Point L1: 50Ni:50Co

Point M1: 70Ni:30Co

Point N1: 80Ni:20Co

Point P1: 90Ni:10Co

Point Q1: Ni

EXAMPLE 19

On the second GMR peak curve G2 in FIG. 5, points R1 and S1 correspond to the respective compositions of points J1, H1, and M1 along the first peak curve G1. R1 is 50Ni:50Co; S1 is 70Ni:30Co; T1 is 80Ni:20Co; and U1 is Ni.

EXAMPLE 20

On the third GMR peak curve G3 in FIG. 5, V1 is 30Ni:70Co; W1 is 50Ni:50Co; X1 is 70Ni:30Co; and Y1 is Ni.

All previous examples of the invention consisted of FM materials and spacers that were all FCC structure, i.e., FCC Systems. However, FIG. 6 illustrates that the linear relationship of equation (3) for the GMR sensor 20 (FIG. 2) at a temperature of 5° K. is maintained when a BCC Systems is observed. The linear relationship is represented by an exemplary curves R1 (FIG. 6).

EXAMPLE 21

On the GMR peak curve R1 (FIG. 6), the exemplary compositions are expressed as X-Y, where element X represents the material for the FM layers, and element Y represents the material for the conductive spacers 22.

| Point | X | Y |
| --- | --- | --- |
| g1 | Fe | Cr |
| i1 | Co | Cu |
| j1 | Co | Ag |

Points i1 and j1 both have FM and conductive spacer materials with FCC crystal structures (i.e., an FCC System). The FM and spacer materials at point g1, however, have BCC structures (i.e., a BCC System), and the latter point is also predicted by the linear relationship of the invention. For example, curve R1 in FIG. 6 may be expressed by the following equation (9), and relates to the GMR first peak:

$$\Delta R/R \equiv 330 - 660|\Delta\chi|^{1/2} \qquad (9)$$

The foregoing example 21 confirms that both FCC and BCC Systems exhibit the same or substantially similar behavior as predicted by equations (3) and (4). Additionally it is shown that an FCC FM layer should be matched with an FCC conductive spacer, and a BCC FM layer should be matched with a BCC conductive spacer for best results. For example, when this crystal structure matching is maintained, (i.e., FCC on FCC and BCC on BCC FM and spacers), the relationships of equations 3 and 4 are exhibited.

Point p on FIG. 6 represents the GMR structure Fe Cu. This structure presents an almost perfect electronegativity match (i.e., (|Δχ|≈0.01) between the Fe and Cu layers). Nonetheless, this structure does not provide a high ΔR/R since Fe is a BCC structure, while Cu is a FCC structure. Accordingly, inferior ΔR/R is obtained and equations 3 and 4 are not observed due to additional potential barriers created by the crystal structure mismatch (i.e., BCC/FCC).

Although the desirability of matching the crystal structure (i.e., FCC FM layer on an FCC spacer, or a BCC FM layer on an BCC spacer), has been described, the need to match such crystal structures may be mitigated in some instances. For example, a BCC element or alloy may be forced by epitaxial effects of an underlying FCC metal or alloy to form an FCC structure for a few monolayers (i.e., 0.5 to 7 monolayers (ML)). The reciprocal situation (i.e., an FCC material on a BCC material), would produce a similar epitaxial effect. Additionally, in FCC Systems some face centered tetragonal structures, representing nearly FCC systems, may be used to advantage as well.

Figure 7:
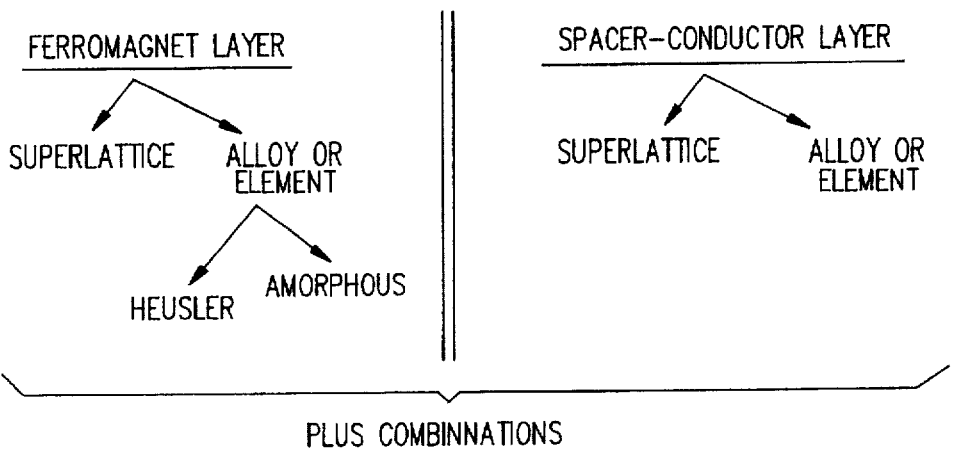
FIG. 7 is a chart that illustrates various exemplary combinations and compositions of FM layers and spacers for use in spin valve and GMR sensors.

FIG. 7 is a chart that illustrates various exemplary combinations and compositions for the FM layers and spacers, some of which are explained by the following examples. In general, the FM layers may be selected from a group comprised of Fe, Co, Ni, and their alloys and their substitutional alloys. In addition, the conductive spacer layers may be selected from a group comprised of Au, Cu, Ag, Rh, Pt, Pd and substitutional alloys thereof, and other suitable elements or intermetallic compounds possessing sufficiently low resistivities. The Heusler alloys shown in FIG. 7 will be discussed later.

EXAMPLE 22

Figure 8:
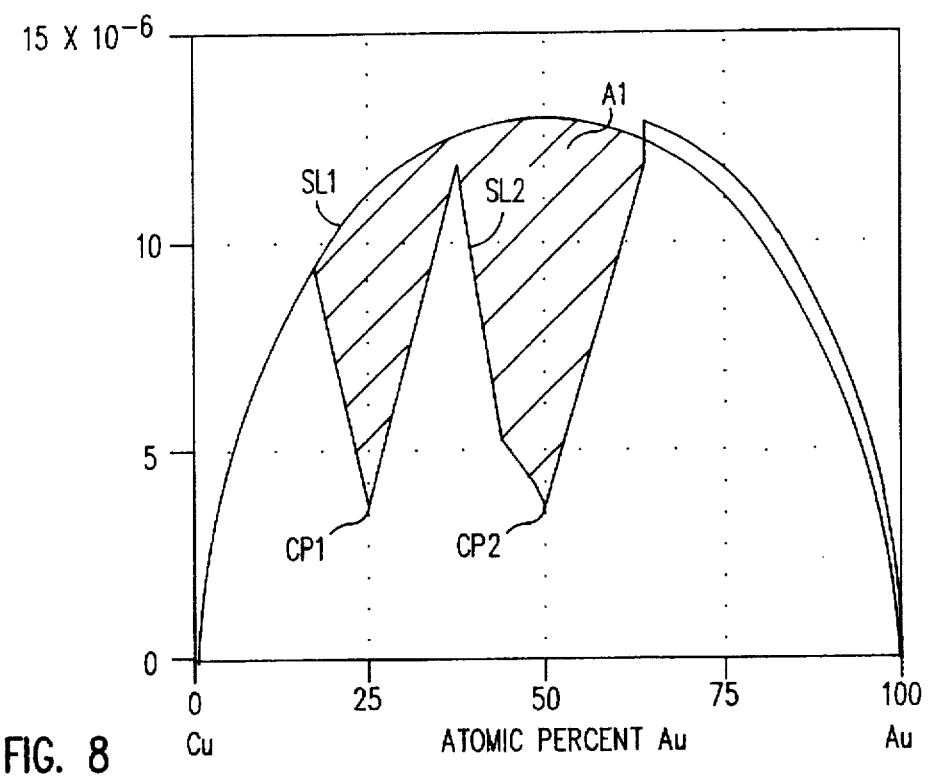
FIG. 8 illustrates two curves plotting the electrical resistivity in microohm-cm versus the atomic composition for a Cu—Au alloy system.

FIG. 8 shows two curves, SL1 and SL2, plotting the electrical resistivity in microohm-cm versus the atomic composition for the Cu Au alloy system. Curve SL1 illustrates the relationship for alloys that have been quenched and cold worked (i.e., in a disordered state). Curve SL2 illustrates the relationship for alloys that are annealed at 200° C. for the purpose of achieving an ordered superlattice structure. FIG. 8 further shows that the electrical resistivities of the ordered alloy relative to the same composition of the disordered alloy may be reduced significantly by annealing the alloys having predetermined atomic compositions. In the Cu Au system shown in FIG. 8, two such predetermined atomic compositions appear, the first (CP1) at 25 atomic percent of Au, and the second (CP2) at 50 atomic percent of Au. These compositions, at which the electrical resistivities of the alloys exhibit a minimum, are a result of an ordered superlattice and will be referred to herein as Critical Points (CP). Additional description of superlattice structures may be found in C. Barrett, "Structure of Metals, Crystallographic Methods, Principles, and Data", 269–296 (1952 2d) which is incorporated herein by reference.

EXAMPLE 23

Figure 9:
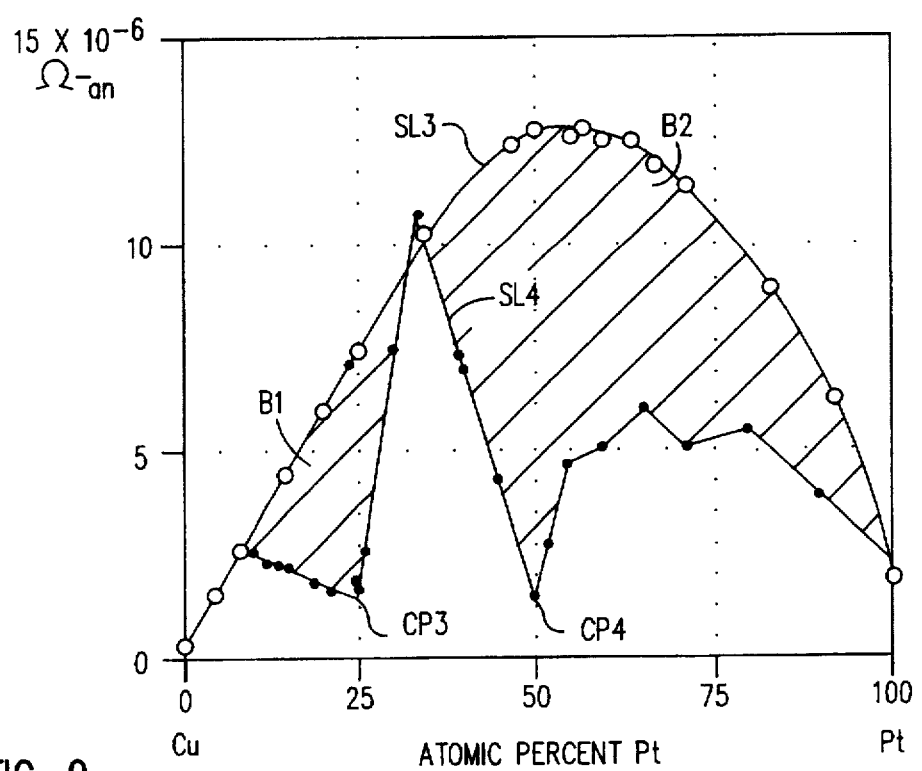
FIG. 9 illustrates two graphs plotting the electrical resistivity in microohm-cm versus the atomic composition for a CuPt alloy system.

FIG. 9 shows two curves SL3, SL4, plotting the electrical resistivity versus atomic composition for the Cu Pt alloy system. Curve SL3 illustrates the relationship for alloys that are quenched and cold worked (disordered state). Curve SL4 illustrates the relationship for alloys that are annealed at 300° C. for achieving an ordered superlattice structure. FIG. 9 further shows that the specific electrical resistivities of the ordered superlattice may be reduced significantly by annealing the alloys at two critical points CP3 (25 atomic percent Pt), and CP4 (50 atomic percent Pt).

While points CP1 and CP2 (FIG. 8), and points CP3 and CP4 (FIG. 9) reflect the most useful compositions, other compositions defined by the hatched areas A1 (FIG. 8) and B1, B2 (FIG. 9) between the envelopes of the disordered alloys (SL1, SL3) and the envelopes of the ordered alloys (SL2, SL4) may also be useful in providing a broader electronegativity selection range, while at the same time producing a partially ordered superlattice that will have some benefit in extending the thermal stability of spin valve and GMR sensors using the ordered alloys.

For example, the two alloy series in examples 22 and 23 may be annealed at between 100° C. to 300° C. in thin film form for approximately 0.5 hour to 4 hours to form the superlattice or partially ordered superlattice at appropriate composition. The invention uses the superlattices processed at or near critical points CP or within any of the shaded regions in the Cu Au binary system or the Cu Pt binary system or other binary systems. The shaded regions define the composition range within which some degree of superlattice order will occur and which may be used advantageously. The most advantageous compositions from a resistivity point of view are a 25 and 50 atomic percent Cu for both the Cu Au and Cu Pt systems. These superlattice alloys and compositions can be utilized to match or minimize the electronegativity difference of 80Ni:20Fe, for example, more advantageously. The benefits are shown in the following examples. Similar superlattice alloys in the Cu Pd system ($Cu_3Pd$ or CuPd) may be used to advantage as well.

EXAMPLE 24

A superlattice spacer 22 (FIG. 2) will provide a large mean free path for electrons in the spacer while simultaneously minimizing the electronegativity difference $|\Delta\chi|$ between the FM layers and the superlattice spacers 22. For example, the Cu Pt superlattice alloy (FIG. 9) exhibits a resistivity of about 3.5 $\mu\Omega$-cm, which is similar to the resistivity of gold, and an average electronegativity of approximately 2.07 eV.

In In this example 80Ni:20Fe is used as an FM layer. The electronegativity of 80Ni:20Fe is about 2.084 eV and the electronegativity of the CuPt superlattice alloy CP4 is approximately 2.07 eV, resulting in an absolute electronegativity difference $|\Delta\chi|$ of about 0.014 eV. This excellent match will significantly minimize the detrimental interfacial scattering component in the spin valve sensor 10 (FIG. 1) and the GMR sensor 20 (FIG. 2), and results in maximizing sensor signal output $\Delta R/R$. This example also exhibits improved corrosion resistance and thermal stability. In addition, adverse electromigration effects in the sensor are minimized.

EXAMPLE 25

In this example, the Cu Au superlattice alloy CP2 of Example 22 (FIG. 8) is used as a spacer, while Co is used as an FM layer. Since the electronegativity of Co is about 2.05 eV and the electronegativity of the Cu Au superlattice alloy CP2 is approximately 2.07 eV, thus resulting in an absolute electronegativity difference $\Delta\chi$ of 0.02, which provides an excellent electronegativity match.

EXAMPLE 26

In this example, a Cu Au superlattice CP2 (FIG. 8) is used as a spacer, while an $Ni_3Fe$ superlattice composition forms the FM layers. The average electronegativity of the Cu Au superlattice CP2 is about 2.07, which has an absolute electronegativity difference of about 0.01 with the $Ni_3Fe$ superlattice.

In addition to increasing the sensor output signals (represented by, for example $\Delta R/R$), the dual superlattice structure increases the thermal stability as well as the chemical stability of the sensors 10 and 20 (FIGS. 1 and 2). Since the superlattice alloys are greatly more corrosion resistant than copper and the ferromagnet alloys, the sensors 10 and 20 using the superlattices formed at or near CPs result in a structure of superior electromigration characteristics as well.

As mentioned earlier, one method for processing the superlattice alloys is to anneal them between 100° C. to 300° C. for 10 to 200 minutes. An alternative method is to deposit the superlattice alloys by sputtering or evaporation, at a relatively low rate, on a sufficiently heated substrate. This slow deposition process could form the superlattice structure without the need for further thermal annealing.

Another advantage for using superlattice structures is that such structures have high critical temperatures above which they become disordered. These critical temperatures can exceed 300° C. in bulk, that is well above the normal operating temperatures of the sensors 10 and 20 and also exceed the processing temperatures normally used in preparing the sensors or superimposed write structures for some devices.

The materials that may be used for FM layers to achieve the preceding objective of minimizing $\Delta\chi$ are from the group of alloys constituting (1) Fe, Ni, Co, or any combination of these elements, and (2) any of the following elements or combinations thereof: Au, Cu, Cr, Mn, Ti, V, Pt, Pd, Ru, Ir, Sn, Ta, Nb, Rh, N, C, Zr, Hf, Y, La, and rare earth elements, having either FCC or BCC structures or in amorphous forms containing a combination of the above elements. A more extensive list of $\chi$ values that may be used to implement the invention is provided in Appendix A, which is incorporated by reference. The values of $\chi$ in Appendix A were calculated using the data and methods described previously in reference to Tables I and II.

EXAMPLE 27

An additional example of desirable alloys to implement the invention is provided by the following group of quaternary FM alloys having minimal magnetostriction:

$(48Co:29Ni:23Fe)_{(1-y)}Pd_y$, and $(26Co:44Ni:30Fe)_{(1-y)}Pd_y$

In the foregoing two alloys, y is an atomic fraction of Pd with a value between 0.12 to 0.30. These alloys display near zero magnetostriction and low coercivity.

Also, the following alloys have near zero magnetostriction and have $\chi$ values of 2.13. Each alloy can be matched with the superlattice conductive spacer of CuPt whose $\chi$ is approximately 2.12:

33.6Co:20.3Ni:16.1Fe:30Pd, and 18.2Co:30.8Ni:21Fe:30Pd.

All previous examples were directed to randomly oriented crystals of ferromagnets and conductive spacers. Because various crystal faces are equally presented to a growing surface during the fabrication of spin valve or GMR sensors, the electronegativity of a randomly oriented crystallographic surface is expressed by equation (10) wherein $\chi$ of each of the principal crystal faces (i.e., <111>, <100> and <110>), contributes equally to the randomly oriented value of $\chi$, as expressed by the following equation:

$$\chi(\text{randomly oriented}) = \frac{1}{3}(\chi_{111} + \chi_{100} + \chi_{110}) \quad (10)$$

Figure 10:
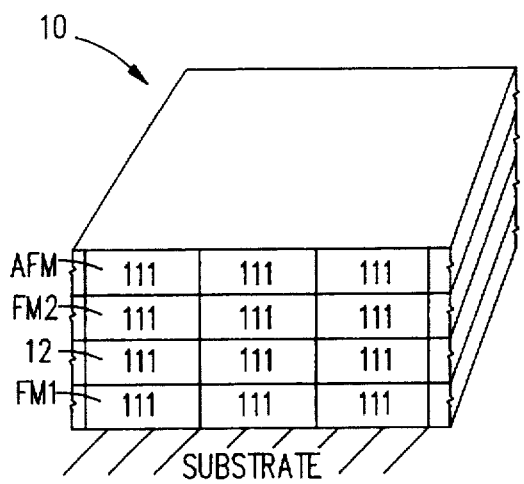
FIG. 10 illustrates a use of random crystal orientation in a spin valve sensor made according to the present invention.

FIG. 10 illustrates the use of randomly oriented crystals in the spin valve sensor 10 of FIG. 1. In this example, the crystalline orientation of the substrate is random, and therefore the three crystallographic orientations (i.e., <100>, <110>, <111>), have approximately the same frequency of surface occupancy on the substrate. As a result, the FM layer that is formed on top of the substrate will develop the same random orientation as the substrate by epitaxy. It is an object of the present invention to match the average electronegativity of each layer to the average electronegativity of the adjacent layers.

The following example 28 illustrates the effect of the mismatch of the electronegativity $|\Delta\chi|$ on the various crystal faces <100>, <110>, <111> of Ni and Cu.

EXAMPLE 28

The electronegativity values and the electronegativity difference for the three faces of Cu and Ni are listed in the following table (data from Michaelson):

| Spacer Layer | | FM Layer | | |
|---|---|---|---|---|
| Cu (face) | $\chi$Cu (face) | Ni (face) | $\chi$Ni (face) | $|\Delta\chi|^{1/2}$ (face) |
| Cu(111) | 2.041 | Ni(111) | 2.204 | 0.404 |
| Cu(100) | 1.87 | Ni(100) | 2.146 | 0.525 |
| Cu(110) | 1.821 | Ni(110) | 2.068 | 0.498 |

Applying equation (5) above, we can illustrate the impact on $\Delta R/R$ as a function of the face, assuming random crystal orientation for a spin value having Ni FM layers and a Cu spacer layer:

$$6.6 R/R = \frac{1}{3}\{[32.30 - 64.60(0.404)]_{111} + [32.30 - 64.60(0.525)]_{100} + [32.30 - 64.60(0.498)]_{110}\}$$

In this equation, if $|\Delta\chi|^{1/2}$ is equal or greater than 0.5 then $\Delta R/R$ is set equal to zero (see FIG. 3), and thus:

$$\Delta R/R = \frac{1}{3}(6.21 + 0 + 0.19)\% \cong 2.13\%$$

This value approximates the experimentally observed value of 2.5 percent provided in example 11, thus indicating that there is a probable weak preferred orientation in the sample, and it was not completely random. This example illustrates that essentially one crystal plane, in this case <111> plane, contributes over approximately 90 percent of the $\Delta R/R$ observed value.

Thus, it is an aspect of this invention to select FM and spacer layers having a single crystallographic orientation that will maximize $\Delta R/R$, e.g. Ni FM layers and Cu spacer layers each having <111>crystal orientations, and achieve a significant improvement in spin value sensor performance. The same aspect applies to GMR structures.

In the above example, it was demonstrated in the Ni—Cu multilayer system that approximately 90 percent of $\Delta R/R$ was due to crystals in the spin valve layers having a <111> crystallographic orientation. It is well known that even in films with random surface orientations of <111>, <100> and <110> planes, epitaxy of the succeeding Cu and FM films will occur, i.e., the orientation effect is carried throughout the structure of the deposited layer.

Figure 11:
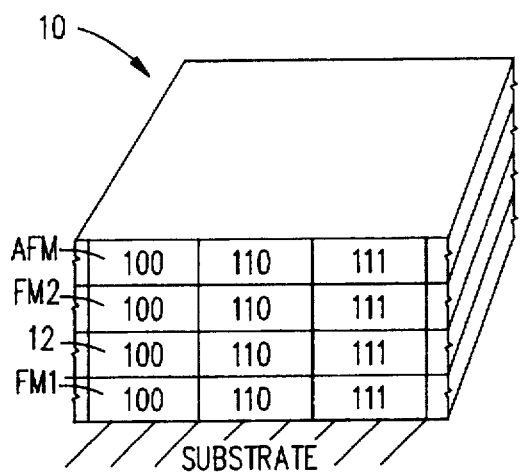
FIG. 11 illustrates a use of preferred crystal orientation in a spin valve sensor made according to the present invention.

The electronegativity matching between adjacent layers, as described in the foregoing equations may be implemented either with polycrystalline FM layers and spacers having preferred crystallographic orientations or single crystal FM layers and spacers having preferred orientations. FIG. 11 illustrates the use of polycrystalline FM layers and spacers having a preferred orientation in the spin valve sensor 10 of FIG. 1. In this example the surface crystalline orientation of the substrate has been selected to be <111>. As a result, the subsequent crystal FM layer and spacers that are formed will develop the same <111> surface orientation. It is an object of the present invention to match the electronegativities of the selected crystalline orientation, which in this example is <111>, of the juxtaposed layers, rather than to match the average electronegativities of these layers.

According to a preferred embodiment, the spin valve sensor 10 (FIG. 1) is formed by selecting a desired spacer material and a preferred one of its three main crystalline orientations, for example <111>. Subsequently, the FM layers are selected such that the $\chi$ of their corresponding faces with a <111> crystalline orientation matches or substantially approximates the $\chi$ of the selected spacer crystalline face (i.e., <111>). Similarly, the <110> and <100> surface faces can be matched as well by selecting the proper alloys.

EXAMPLE 29

The selection of a preferred crystal orientation (i.e., <111>, <100> or <110>), can be accomplished by selecting a substrate such as magnesium oxide with a surface orientation of either <111>, <100> or <110>. By selecting a single orientation, for example <111>, of the substrate and subsequently selecting a ferromagnet and conductive spacer whose $\Delta\chi$'s for the selected crystal orientations are minimized, and subsequently depositing alternating layers of FM and conductive spacers on such an oriented substrate, the resulting $\Delta R/R$'s will be greater than FM and spacer structures having randomly oriented crystals.

Prior to the deposition of alternating ferromagnets and spacers with preferred crystallographic orientations, it would be desirable to deposit a layer of Pt, Pd, Au or Cu of 10 Å to 50 Å with subsequent annealing at approximately 250°–400° C. to establish an epitaxial-oriented metal film from which subsequent epitaxy of the selected alternating FM and spacer materials are then subsequently deposited, with epitaxial integrity maintained at each subsequent layer in the formation of a spin valve or GMR structure.

Since interfacial diffusion kinetics between the FM and the conductor spacer are expected to be a function of selected crystal orientation (i.e., <111>, <100> or <110>), the surface roughness of each selected orientation is optimized by optimizing the deposition conditions for each orientation. In this way, a maximum $\Delta R/R$ can be achieved for each principal orientation (i.e., <111>, <100> or <110>).

Since no $\chi$ or $\phi$ values are found in the literature for alloys, $\chi$ values for the <111>, <100>, <110> faces must be estimated. First, equation (2) is used to calculate a $\chi$ for a randomly oriented alloy from the randomly oriented $\chi$ values of the constituent elements. Then, estimates are developed for correlation factors between $\chi$ values for randomly oriented FCC elements ($\chi_R$) and $\chi$ values for FCC elements having a single orientation ($\chi_s$) For example, using data from Michaelson and the relation $\chi_R = (\chi_{111} + \chi_{100} + \chi_{110})//3$, the following ratios were derived in FCC Systems:

$\chi_{111} \simeq 1.027 \chi_R$ $\chi_{100} \simeq 1.007 \chi_R$ $\chi_{110} \simeq 0.965 \chi_R$ These ratios permit the estimation of $\chi_s$ of FM layers or spacers having a single crystal orientation from the $\chi_R$ of FM layers or spacers having a random crystal orientation, for the purpose of minimizing $|\Delta\chi|$.

Although MR sensors have been reported wherein the FM layers and spacers have been selected to have the same crystallographic orientation, there has been no teaching of selecting an orientation of an FM layer or spacer based on its $\chi$ to match a $\chi$ of another preferred orientation of FM layer or spacer. Of the reported MR sensors in which single crystallographic orientations for FM layers and spacers were used, $|\Delta\chi|$ values were calculated using the teachings of the inventor. The lowest $|\Delta\chi|$ thus calculated was for a Co/Cu FCC System, wherein the $|\Delta\chi|$ was approximately 0.14 eV.

Figure 12:
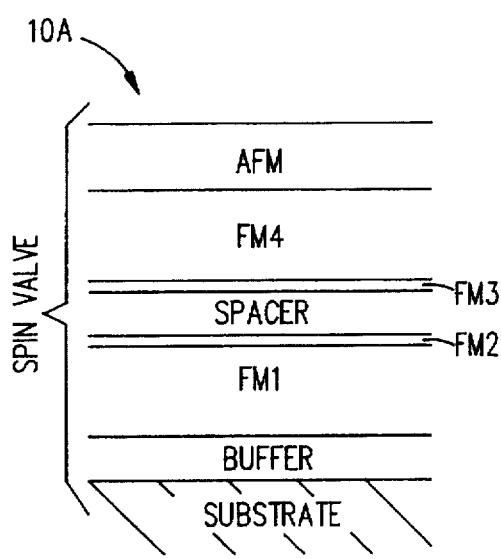
FIG. 12 is a cross-sectional view of a spin valve sensor with compound interfaces made according to the present invention.
Figure 13:
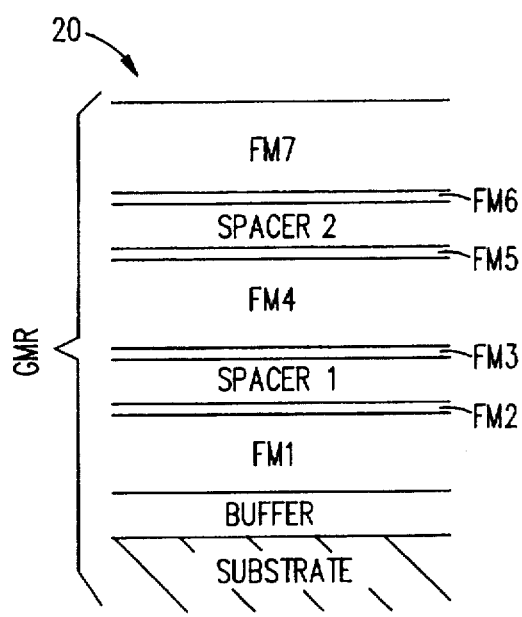
FIG. 13 is a cross-sectional view of a giant magnetoresistive sensor with compound interfaces made according to the present invention.

An additional aspect of the invention is shown in FIGS. 12 and 13, which illustrate a spin valve sensor 10A and a GMR sensor 20A respectively comprised of compound FM layers. The spin valve sensor 10A (FIG. 12) includes two or more compound FM layers (FM1/FM2) and (FM3/FM4), each of which are composed of different ferromagnetic materials. Similarly, the GMR sensor 20A (FIG. 13) includes a plurality of electrically conductive spacers, such as Spacer 1 and Spacer 2, that are interposed between and compound FM layers, such as (FM1/FM2), (FM3/FM4), (FM4/FM5) and (FM6/FM7). As explained in example 3 previously, the FM materials for these compound layers should be selected so that the values of $\lambda_s$ and $H_c$ for each material (e.g. FM1 and FM2) will combine to produce low values of $\lambda_s$ and $H_c$, for the layers (e.g. FM1/FM2). Further, the interfaces between the FM layers and spacers (e.g. FM2/Spacer and FM3/Spacer) follow the electronegativity matching and other selection criteria described herein.

In addition, the use of compound FM layers enables the adjustment of the overall $\lambda_s$ for the spin valve sensor 10A and the GMR sensor 20A. For the structures of FIG. 12 (spin valve) and FIG. 13 (GMR), FM1 and FM4 may be identical compositions, or may be different compositions, and the same applies to FM2 and FM3. It may be advantageous, however, that FM2 and FM3 have the same composition and that FM1 and FM4 have the same composition in order to simplify processing because fewer sputtering targets would be needed.

The basis for having two or more different compositions for FM1 and FM2 is that the magnetostriction thickness product of FM1 and FM2 may be selected so that $\lambda_{FM1} t_{FM1}$ is approximately equal to $-\lambda_{FM2} t_{FM2}$, where t is FM layer thickness, resulting in minimizing an average $\lambda_s$ for both layers, which average $\lambda_s$ desirably approaches zero for the compound FM interfaces. It is not necessary to absolutely match the magnetostriction thicknesses products in order to minimize magnetostriction. For example, if the ratio of magnetostriction thickness products is even in the range of 0.3 to 3, the overall $\lambda_s$ of the compound FM layer FM1/FM2 will be reduced. Even an unbalanced thickness product of each layer will lower $\lambda_s$, which minimizes $\lambda_s$ of a compound FM layer structure.

As previously noted, the use of compound FM layer also enables the minimization of the overall $H_c$ of the layers because the $H_c$ of the layer is generally the average of the $H_c$ values for each FM material forming the layer (i.e., FM1 and FM2). For example, an FM2 selected for a good $\chi$ match with the spacer may have a high $H_c$. This adverse effect can be mitigated by selecting an material for FM1 that has a very low $H_c$, without regard to matching its $\chi$ with that of the spacer. Thus a low $H_c$ for the compound FM layers, such as less than 10 oersteds, may be obtained.

It is important, however, that the $\chi$ of the FM layer adjacent to the spacers (e.g., FM2 or FM3) be minimized relative to the $\chi$ of the adjacent spacer. Similar conditions apply to the GMR structure of FIG. 13 as well.

Thus, the compound FM structure in spin valve structures and GMR structures, in combination with the preceding teaching requiring the minimization of $\Delta\chi$ between FM and spacer, allows for maximizing $\Delta R/R$ while simultaneously maximizing corrosion resistance and minimizing the $\lambda_s$ and $H_c$ of compound ferromagnet structures of spin valve structures or GMR structures or GMR structures.

EXAMPLE 30

Heusler alloys represent another class of ferromagnetic materials possessing a superlattice structure that may be partially or fully ordered. Full ordering is possible at or very near to the general stoichiometric composition $M_2MnM_1$ and may contain ferromagnetic elements Co and Ni as well as the nonferromagnetic elements Cu, Ir, Pd, Pt and Au for $M_2$. $M_1$ may be Al, Ga, Ge, As, In, Si, Sn or Bi. The Heusler alloys containing only Pt, Au, Pd or Ir for $M_2$ (i.e., $M_2$ having a full complement of such element, e.g., $Au_2$), exhibit Curie temperatures below room temperatures (i.e., below 300° K.). Accordingly such alloys may, if they are not ferromagnetic and their bulk resistivity is less than approximately 30 $\mu\Omega$-cm, be used as spacers for other ferromagnetic Heusler alloys. It is also possible to combine the following elements in $M_2$: Cu, Co, Ni, Pd, Pt, Au and Ir, for the purpose of fine control of the electronegativity of the Heusler alloy to minimize $\Delta\chi$ of the Heusler alloy and its spacer element or alloy or compound.

A representative series of FM Heusler alloys and their electronegativities is illustrated below:

| Heusler Alloy | $\chi$ Alloy |
| --- | --- |
| $Cu_2MnAl$ | 1.80 |
| $Ni_2MnSn$ | 1.93 |
| $Co_2MnGe$ | 1.94 |
| $Co_2MnSi$ | 1.93 |
| $Co_2MnSn$ | 1.89 |
| CuPdMnSn | 1.92 |
| NiAuMnSn | 1.95 |

The FM Heusler alloys may be used in conjunction with spacer materials such as Cu, CuAu alloys (with Au of 5 to 15 atomic percent) and intermetallic spacers $Al_2Au$ (with $\chi$ equal to 1.88) and $PtAl_2$ (with $\chi$ equal to 1.92). AgAu alloys may be used as well with Au less than 25 atomic percent.

By virtue of this invention, a method and means are provided for selecting the materials for spin valve and GMR sensors which simultaneously may have higher magnetoresistance output, improved corrosion resistance, improved coercivity, improved thermal stability of the interfaces and improved electromigration properties. By virtue of this invention, a method and means are provided for selecting the materials for spin valve and GMR sensors which simultaneously may have higher magnetoresistance output, improved corrosion resistance, improved coercivity, improved thermal stability of the interfaces and improved electromigration properties.

APPENDIX A

A list of χ values for elements that may be used as ferromagnetic layers and conductive spacers is provided below:

| Element | Polycrystalline χ (eV) | Bulk Crystal Structure |
|---|---|---|
| Au | 2.22 | FCC |
| Fe | 1.90 | BCC |
| Cu | 1.91 | FCC |
| Ag | 1.89 | FCC |
| Pt | 2.34 | FCC |
| Pd | 2.32 | FCC |
| Ir | 2.32 | FCC |
| Rh | 2.04 | FCC |
| Co | 2.05 | FCC in thin films |
| Ni | 2.13 | FCC |
| Mn | 1.65 | Complex |
| Cr | 1.83 | BCC |
| Ti | 1.76 | |
| V | 1.74 | BCC |
| Ru | 1.92 | CPH close packed hexagonal |
| Sn | 1.79 | Complex |
| Ta | 1.73 | BCC |
| Nb | 1.75 | BCC |
| Zr | 1.63 | BCC CPH |
| Hf | 1.57 | CPH |
| Y | 1.21 | CPH |
| La | 1.39 | FCC CPH |
| Rare earth elements | ~1.21 | Complex CPH FCC BCC |
| C | ~2.52 | Various forms |
| N | ~3.01 | Gaseous |
| Al | ~1.72 | FCC |
| Ge | ~2.00 | |
| Si | ~1.96 | |
| Bi | 1.71 | |
| As | 1.50 | |

What is claimed is:

1. A method of optimizing the interfacial properties of a magnetoresistive sensor comprising the steps of:

selecting first and second ferromagnetic layers, each having similar crystallographic orientations, said first ferromagnetic layer having a first electronegativity; and selecting an electrically conductive spacer disposed between said ferromagnetic layers and having a crystallographic orientation similar to said ferromagnetic crystallographic orientations and having a second electronegativity so that an absolute value of a difference between said first and second electronegativities is minimized.

2. The method as in claim 1, wherein, each of said selecting steps includes selecting a single crystal material for said ferromagnetic layers and said electrically conductive spacer.

3. The method as in claim 1, wherein said step of selecting said ferromagnetic layers includes selecting a ferromagnetic layer material with a face centered cubic structure; and wherein said step of selecting said conductive spacer includes selecting a spacer material with a face centered cubic structure and wherein said absolute value is equal to or less than approximately 0.14 eV.

4. The method as in claim 1, wherein said step of selecting said ferromagnetic layers includes selecting a ferromagnetic layer material with a body centered cubic structure; and wherein said step of selecting said conductive spacer includes layers comprise single crystal structures and said electrically conductive spacer comprises a single crystal.

5. A method of optimizing the interfacial properties of a magnetoresistive sensor comprising the steps of:

selecting first and second ferromagnetic layers, each having random crystallographic orientations, said first ferromagnetic layer having a first electronegativity; and selecting an electrically conductive spacer disposed between said ferromagnetic layers and having a random crystallographic orientation and having a second electronegativity so that an absolute value of a difference between said first and second electronegativities is minimized.

6. The method as in claim 5, wherein said step of selecting said ferromagnetic layers includes selecting ferromagnetic layer materials with face centered cubic structures; and wherein said step of selecting said conductive spacer includes selecting a spacer material with a face centered cubic structure and wherein said absolute value is less than approximately 0.12 eV.

7. The method as in claim 5, wherein said step of selecting said ferromagnetic layers includes selecting ferromagnetic layer materials with body centered cubic structures; and wherein said step of selecting said conductive spacer includes selecting a spacer material with a body centered cubic structure wherein said absolute value is less than approximately 0.07 eV.

8. A magnetoresistive sensor disposed on a substrate comprising:

first and second ferromagnetic layers, each having similar crystallographic orientations, said first ferromagnetic layer having a first electronegativity; and an electrically conductive spacer interposed between said ferromagnetic layers and having a crystallographic orientation similar to said ferromagnetic crystallographic orientations and having a second electronegativity so that an absolute value of a difference between said first and second electronegativities is minimized.

9. The sensor as in claim 8, wherein said ferromagnetic layers comprise materials having face centered cubic structures; and wherein said conductive spacer comprises a material having a face centered cubic structure and wherein said absolute value is equal to or less than approximately 0.14 eV.

10. The sensor as in claim 8, wherein said ferromagnetic layers comprise materials having a body centered cubic structure; and wherein said conductive spacer comprises material having a body centered cubic structure.

11. A magnetoresistive sensor comprising:

first and second ferromagnetic layers, each having random crystallographic orientations, said first ferromagnetic layer having a first electronegativity; and an electrically conductive spacer interposed between said ferromagnetic layers and having a random crystallographic orientation and having a second electronegativity so that an absolute value of a difference between said first and second electronegativities is minimized.

12. The sensor as in claim 11, wherein said ferromagnetic layers comprise materials having face centered cubic structures; and wherein said conductive spacer comprises a material having a face centered cubic structure and wherein said absolute value is less than approximately 0.12 eV.

13. The sensor as in claim 11,
   wherein said ferromagnetic layers comprise materials having a body centered cubic structure; and
   wherein said conductive spacer comprises material having a body centered cubic structure and wherein said absolute value is less than approximately 0.07 eV.

14. A magnetoresistive sensor disposed on a substrate comprising in combination:
   a first ferromagnetic layer means formed over said substrate and having a first electronegativity;
   electrically conductive spacer means formed on said first ferromagnetic layer means and having a second electronegativity
   so that a magnetoresistance effect (ΔR/R) of the sensor is optimized by correlating said first and second electronegativities to ΔR/R by the following equation:

$$\Delta R/R \simeq A - B|\Delta\chi|^n$$

where A and B are constant values and $|\Delta\chi|$ is an absolute value of the difference between said first and second electronegativities; and
   a second ferromagnetic layer means formed on said substrate.

15. The sensor as in claim 14, wherein said ferromagnetic layer means constitutes a plurality of ferromagnetic layers; and said conductive spacer means comprises a number of spacer layers interposed between said ferromagnetic layers; and
   wherein said absolute value is minimized.

16. The sensor as in claim 15,
   wherein said ferromagnetic layers comprise materials having face centered cubic structures; and
   wherein said conductive spacer comprises a material having a face centered cubic structure, and wherein said absolute value is less than 0.12 eV.

17. A magnetoresistive sensor disposed on a substrate comprising:
   first and second ferromagnetic layers, wherein at least one of said layers comprise a superlattice material; and
   an electrically conductive spacer interposed between said ferromagnetic layers.

18. The sensor of claim 17, wherein said electrically conductive spacer comprises a superlattice material.

19. The sensor of claim 17, wherein said first ferromagnetic layer has a first electronegativity, said electrically conductive spacer has a second electronegativity and an absolute value of a difference between said first and second electronegativities is minimized.

20. A magnetoresistive sensor comprising:
   a first and second ferromagnetic layer; and
   an electrically conductive spacer interposed between said ferromagnetic layers;
   wherein said first ferromagnetic layer comprises a first compound ferromagnetic layer having a first material with a first magnetostriction and a first thickness and a second ferromagnetic material with a second magnetostriction and a second thickness; and
   wherein a difference between a first product of said first thickness and said first magnetostriction and a second product of said second thickness and said second magnetostriction is minimized.

21. The sensor as in claim 20, wherein a ratio between said first and second products is in a range of approximately 0.3 to approximately 3.

22. The sensor as in claim 20, wherein said first and second materials have a first and second coercivity, respectfully, and an average of said first and second coercivities is minimized.

23. The sensor as in claim 22, wherein said average is less than approximately ten oersteds.

24. The sensor as in claim 20, wherein said first ferromagnetic material has a first electronegativity and is in atomic contact with said electrically conductive spacer, wherein said spacer has a second electronegativity and wherein an absolute value of a difference between said first and second electronegativities is minimized.

25. The sensor as in claim 20, wherein said second ferromagnetic layer comprises a second compound ferromagnetic layer having a third ferromagnetic material and a fourth ferromagnetic material in atomic contact with said electrically conductive spacer, and wherein said first and fourth ferromagnetic materials comprise substantially the same composition and said second and third ferromagnetic materials comprise substantially the same composition.

\* \* \* \* \*